United States Patent
Tapily et al.

(10) Patent No.: US 10,410,858 B2
(45) Date of Patent: Sep. 10, 2019

(54) SELECTIVE FILM DEPOSITION USING HALOGEN DEACTIVATION

(71) Applicant: Tokyo Electron Limited, Minato-ku, Tokyo (JP)

(72) Inventors: Kandabara N. Tapily, Mechanicville, NY (US); Takaaki Tsunomura, Akasaka (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/101,049

(22) Filed: Aug. 10, 2018

(65) Prior Publication Data

US 2019/0051521 A1 Feb. 14, 2019

Related U.S. Application Data

(60) Provisional application No. 62/544,460, filed on Aug. 11, 2017.

(51) Int. Cl.
*H01L 21/31* (2006.01)
*H01L 21/469* (2006.01)
(Continued)

(52) U.S. Cl.
CPC .... *H01L 21/02315* (2013.01); *H01L 21/0228* (2013.01); *H01L 21/02178* (2013.01);
(Continued)

(58) Field of Classification Search
CPC ......... H01L 21/02315; H01L 21/02178; H01L 21/02181; H01L 21/02186; H01L 21/02189
(Continued)

(56) References Cited

U.S. PATENT DOCUMENTS

| 7,625,820 B1 | 12/2009 | Papasouliotis et al. |
| 2005/0271813 A1 | 12/2005 | Kher et al. |

(Continued)

FOREIGN PATENT DOCUMENTS

| JP | 2004083945 A | 3/2004 |
| JP | 2011157571 A | 8/2011 |

OTHER PUBLICATIONS

Korean Intellectual Property Office, International Search Report and Written Opinion for International application No. PCT/US2018/046277, dated Dec. 4, 2018, 10pp.

(Continued)

*Primary Examiner* — David S Blum

(57) ABSTRACT

Embodiments of the invention provide selective film deposition in a recessed feature of a substrate using halogen deactivation. A substrate processing method includes a) providing a substrate containing a field area and a recessed feature having a sidewall and a bottom, b) exposing the substrate to a first precursor gas to form a first precursor layer on the substrate, c) exposing the substrate to a plasma-excited halogen-containing gas to deactivate or at least partially remove the first precursor layer on the field area of the substrate and the bottom of the recessed feature, and d) exposing the substrate to a second precursor gas that reacts with the first precursor layer to form a material layer on the sidewall of the recessed feature but not on the field area and the bottom of the recessed feature that has been deactivated by the plasma-excited halogen-containing gas.

20 Claims, 6 Drawing Sheets

(51) Int. Cl.
  *H01L 21/02* (2006.01)
  *H01L 21/32* (2006.01)
(52) U.S. Cl.
  CPC .. *H01L 21/02181* (2013.01); *H01L 21/02186* (2013.01); *H01L 21/02189* (2013.01); *H01L 21/02205* (2013.01); *H01L 21/32* (2013.01)
(58) Field of Classification Search
  USPC .......................................................... 438/761
  See application file for complete search history.

(56) References Cited

U.S. PATENT DOCUMENTS

2008/0096374 A1* 4/2008 Shamiryan ........ H01L 21/28035
  438/591
2015/0279665 A1 10/2015 Zafiropoulo

OTHER PUBLICATIONS

Sharma, A. et al. "Atomic layer deposition of HfO2 using HfCp(NMe2)3 and O2 plasma," Journal of Vacuum Science and Technology, A: Vacuum, Surfaces, and Films, 35(1), Jan. 1, 2017, pp. 01B130-1-01B130-8.

* cited by examiner

SELECTIVE FILM DEPOSITION USING HALOGEN DEACTIVATION

CROSS-REFERENCE TO RELATED APPLICATIONS

This application is related to and claims priority to U.S. Provisional Patent application Ser. No. 62/544,460 filed on Aug. 11, 2017, the entire contents of which are herein incorporated by reference.

FIELD OF INVENTION

The present invention relates to the field of semiconductor manufacturing and semiconductor devices, and more particularly, to selective film deposition using halogen deactivation.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after extreme ultraviolet lithography (EUV) introduction. Patterning options that enable reduced variability, extend scaling and enhanced CD and process control are needed. Selective formation of thin films is a key step in patterning in highly scaled technology nodes.

SUMMARY OF THE INVENTION

Embodiments of the invention provide selective film deposition in a recessed feature of a substrate using halogen deactivation. According to one embodiment, a substrate processing method is provided that includes a) providing a substrate containing a field area and a recessed feature having a sidewall and a bottom, b) exposing the substrate to a first precursor gas to form a first precursor layer on the substrate, c) exposing the substrate to a plasma-excited halogen-containing gas to deactivate or at least partially remove the first precursor layer on the field area of the substrate and the bottom of the recessed feature, and d) exposing the substrate to a second precursor gas that reacts with the first precursor layer to form a material layer on the sidewall of the recessed feature but not on the field area and the bottom of the recessed feature that has been deactivated by the plasma-excited halogen-containing gas. Steps b)-d) may be repeated at least once to deposit an additional amount of the material layer on the sidewall in the recessed feature.

According to another embodiment, a substrate processing method is provided that includes a) providing a substrate containing a field area and a recessed feature having a sidewall and a bottom, b) exposing the substrate to a first precursor gas to form a first precursor layer on the substrate, c) exposing the substrate to a halogen-containing gas in the absence of a plasma to deactivate the first precursor layer on the field area of the substrate, and d) exposing the substrate to a second precursor gas that reacts with the first precursor layer to form a material layer on the sidewall and the bottom of the recessed feature but not on the field area that has been deactivated by the halogen-containing gas. Steps b)-d) may be repeated at least once to deposit an additional amount of the material layer on the sidewall and the bottom in the recessed feature. In one example, the material layer may at substantially fill the recessed feature.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
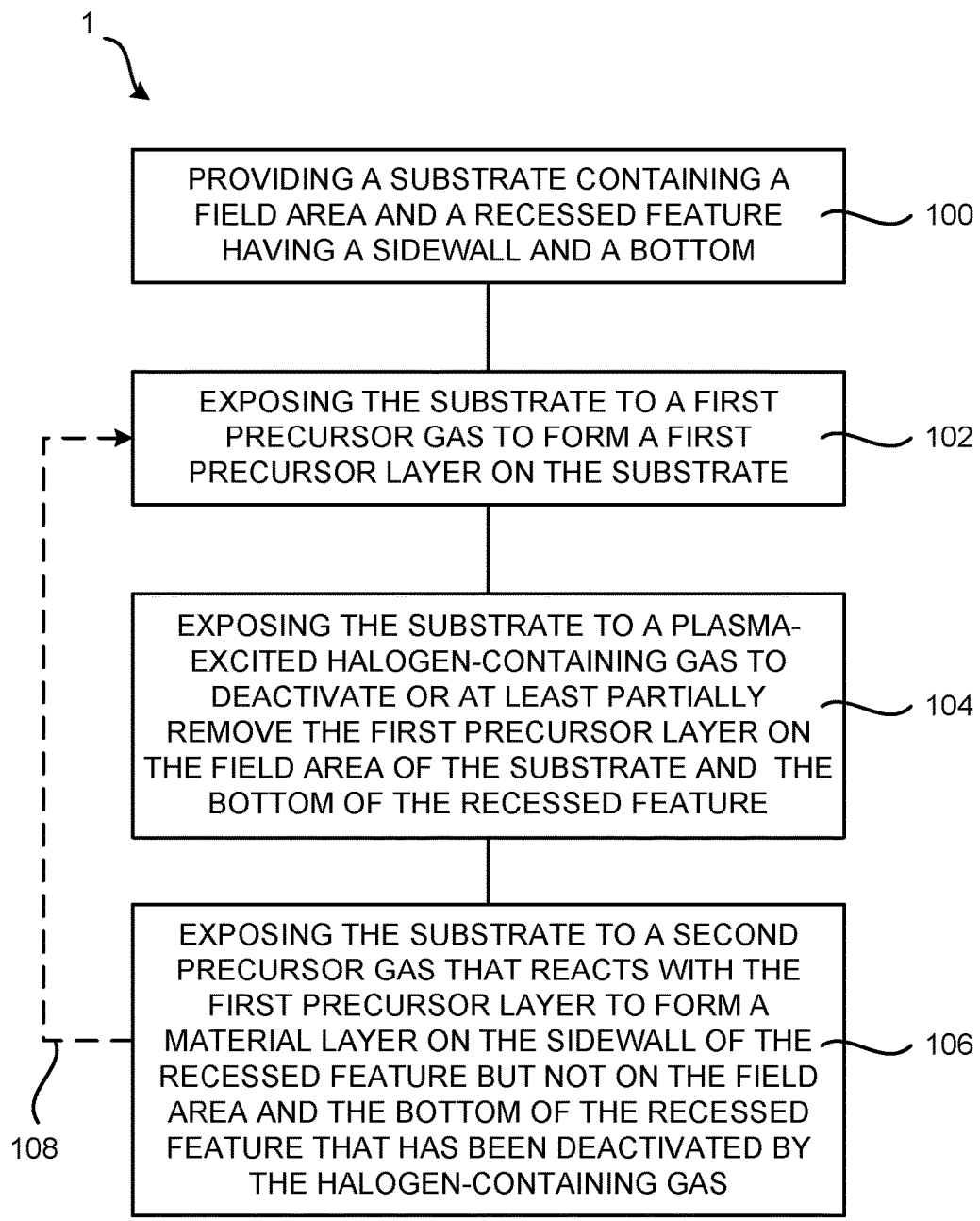
FIG. 1 is a process flow diagram for processing a substrate according to an embodiment of the invention.

FIG. 1 is a process flow diagram for processing a substrate according to an embodiment of the invention, and FIGS. 2A-2F schematically show through cross-sectional views a method of processing a substrate according to an embodiment of the invention.

Figure 2A:
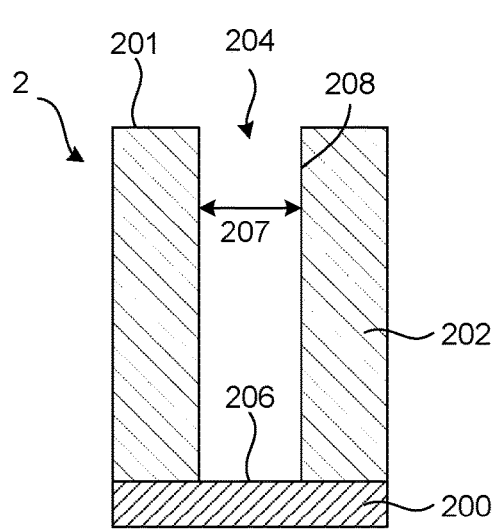
FIGS. 2A-2F schematically show through cross-sectional views a method of processing a substrate according to an embodiment of the invention.

The process flow 1 includes in 100, providing a substrate 2 containing a first film 202 and a second film 200. This is schematically shown in FIG. 2A. The first film 202 has a field area 201 around a recessed feature 204, where the recessed feature 204 has a sidewall 208 and a bottom 206. The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed feature 204 can, for example, have a depth of 25 nm, 50 nm, 100 nm, 200 nm, or greater.

In some examples, the first film 202 and the second film 200 may contain or consist of the same material. In one example, the first film 202 and the second film 200 may contain or consist of Si. In some examples, the first film 202 may contain a dielectric material, for example $SiO_2$, SiON, SiN, a high-k material, a low-k material, or an ultra-low-k material. The recessed feature 204 may be formed using well-known lithography and etching processes. Although not shown in FIG. 2A, a patterned mask layer may be present on the field area 201 and define the opening of the recessed feature 204.

Figure 2B:
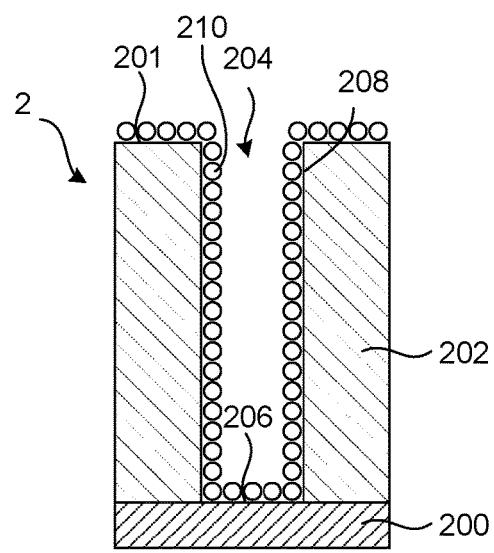

The process flow 1 further includes, in 102, exposing the substrate 2 to a first precursor gas to form a first precursor layer 210 on the substrate 2, including on the field area 201, the sidewall 208 and the bottom 206. This is schematically shown in FIG. 2B. The exposing may be a saturation exposure that forms a saturation coverage of the first precursor layer 210 on the substrate 2. In one example, the first precursor gas can include a metal-containing precursor and the first precursor layer 210 can form an adsorbed conformal layer of the metal-containing precursor that is approximately one atomic layer thick. The metal-containing precursor can, for example, contain an alkaline earth element, titanium, hafnium, zirconium, aluminum, a rare earth element, or combination of two or more thereof.

Embodiments of the invention may utilize a wide variety of hafnium and zirconium precursors. For example, representative examples include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $HfCl_4$, $ZrCl_4$, $ZrCp_2Me_2$, $Zr(tBuCp)_2Me_2$, and $Zr(NiPr_2)_4$. In one example, the hafnium and zirconium precursors may have the same ligands (e.g., HTB and ZTB), thereby preventing any possible detrimental ligand exchange between the precursors.

Embodiments of the inventions may utilize a wide variety of different aluminum precursors. For example, many aluminum precursors have the formula:

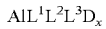

$AlL^1L^2L^3D_x$ where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $Al_2Me_6$, $Al_2Et_6$, $[Al(OsBu)_3]_4$, $Al(CH_3COCHCOCH_3)_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$.

Embodiments of the inventions may utilize a wide variety of different rare earth precursors. For example, many rare earth precursors have the formula:

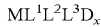

$ML^1L^2L^3D_x$ where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of rare earth precursors include:

Y precursors: $Y(N(SiMe_3)_2)_3$, $Y(N(^iPr)_2)_3$, $Y(N(^tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(^iPr))_3$.

La precursors: $La(N(SiMe_3)_2)_3$, $La(N(^iPr)_2)_3$, $La(N(^tBu)SiMe_3)_3$, $La(TMPD)_3$, $((^iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3 \cdot CH_3(OCH_2CH_2)_3OCH_3$, $La(C_{11}H_{19}O_2)_3 \cdot CH_3(OCH_2CH_2)_4OCH_3$, $La(O(^iPr))_3$, $La(OEt)_3$, $La(acac)_3$, $La(((^tBu)_2N)_2CMe)_3$, $La(((^iPr)_2N)_2CMe)_3$, $La(((^iPr)_2N)_2CH)_3$, $La(((^tBu)_2N)_2C(tBu))_3$, $La(((^iPr)_2N)_2C(^tBu))_3$, and $La(FOD)_3$.

Ce precursors: $Ce(N(SiMe_3)_2)_3$, $Ce(N(^iPr)_2)_3$, $Ce(N(^tBu)SiMe_3)_3$, $Ce(TMPD)_3$, $Ce(FOD)_3$, $(^iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3 \cdot CH_3(OCH_2CH_2)_3OCH_3$, $Ce(C_{11}H_{19}O_2)_3 \cdot CH_3(OCH_2CH_2)_4OCH_3$, $Ce(O(^iPr))_3$, and $Ce(acac)_3$.

Pr precursors: $Pr(N(SiMe_3)_2)_3$, $(^iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 \cdot CH_3(OCH_2CH_2)_3OCH_3$, $Pr(O(^iPr))_3$, $Pr(acac)_3$, $Pr(hfac)_3$, $Pr(((^tBu)_2N)_2CMe)_3$, $Pr(((^iPr)_2N)_2CMe)_3$, $Pr(((^tBu)_2N)_2C(^tBu))_3$, and $Pr(((^iPr)_2N)_2C(^tBu))_3$.

Nd precursors: $Nd(N(SiMe_3)_2)_3$, $Nd(N(^iPr)_2)_3$, $(^iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(^iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $(^iPr)Cp)_3Sm$, $Cp_3Sm$, $Sm(THD)_3$, $Sm[OOCCH(C_2H_5)C_4H_9]_3$, $Sm(O(^iPr))_3$, $Sm(acac)_3$, and $(C_5Me_5)_2Sm$.

Eu precursors: $Eu(N(SiMe_3)_2)_3$, $(^iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(^iPr))_3$, $Eu(acac)_3$, and $(C_5Me_5)_2Eu$.

Gd precursors: $Gd(N(SiMe_3)_2)_3$, $(^iPr)Cp)_3Gd$, $Cp_3Gd$, $Gd(THD)_3$, $Gd[OOCCH(C_2H_5)C_4H_9]_3$, $Gd(O(^iPr))_3$, and $Gd(acac)_3$.

Tb precursors: $Tb(N(SiMe_3)_2)_3$, $((^iPr)Cp)_3Tb$, $Cp_3Tb$, $Tb(THD)_3$, $Tb[OOCCH(C_2H_5)C_4H_9]_3$, $Tb(O(^iPr))_3$, and $Tb(acac)_3$.

Dy precursors: $Dy(N(SiMe_3)_2)_3$, $((^iPr)Cp)_3Dy$, $Cp_3Dy$, $Dy(THD)_3$, $Dy[OOCCH(C_2H_5)C_4H_9]_3$, $Dy(O(^iPr))_3$, $Dy(O_2C(CH_2)_6CH_3)_3$, and $Dy(acac)_3$.

Ho precursors: $Ho(N(SiMe_3)_2)_3$, $(^iPr)Cp)_3Ho$, $Cp_3Ho$, $Ho(THD)_3$, $Ho[OOCCH(C_2H_5)C_4H_9]_3$, $Ho(O(^iPr))_3$, and $Ho(acac)_3$.

Er precursors: $Er(N(SiMe_3)_2)_3$, $(^iPr)Cp)_3Er$, $((nBu)Cp)_3Er$, $Cp_3Er$, $Er(THD)_3$, $Er[OOCCH(C_2H_5)C_4H_9]_3$, $Er(O(^iPr))_3$, and $Er(acac)_3$.

Tm precursors: $Tm(N(SiMe_3)_2)_3$, $((^iPr)Cp)_3Tm$, $Cp_3Tm$, $Tm(THD)_3$, $Tm[OOCCH(C_2H_5)C_4H_9]_3$, $Tm(O(^iPr))_3$, and $Tm(acac)_3$.

Yb precursors: $Yb(N(SiMe_3)_2)_3$, $Yb(N(^iPR)_2)_3$, $((^iPr)Cp)_3Yb$, $Cp_3Yb$, $Yb(THD)_3$, $Yb[OOCCH(C_2H_5)C_4H_9]_3$, $Yb(O(^iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $(^iPr)Cp)_3Lu$, $Cp_3Lu$, $Lu(THD)_3$, $Lu[OOCCH(C_2H_5)C_4H_9]_3$, $Lu(O(Pr))_3$, and $Lu(acac)_3$.

Figure 2C:
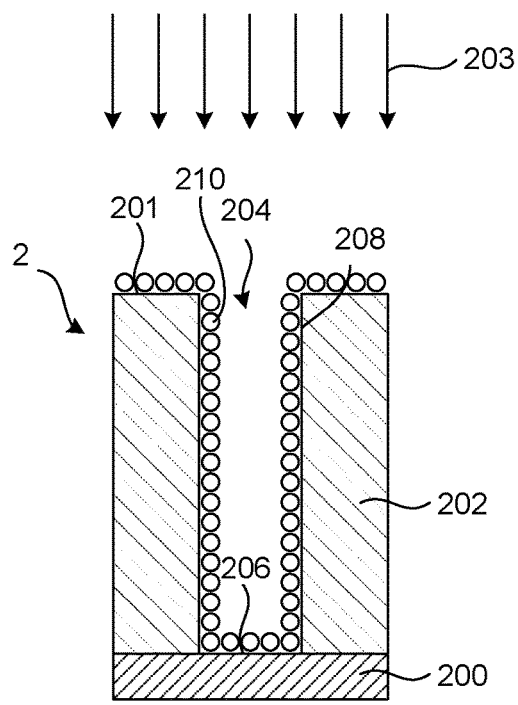
Figure 2D:
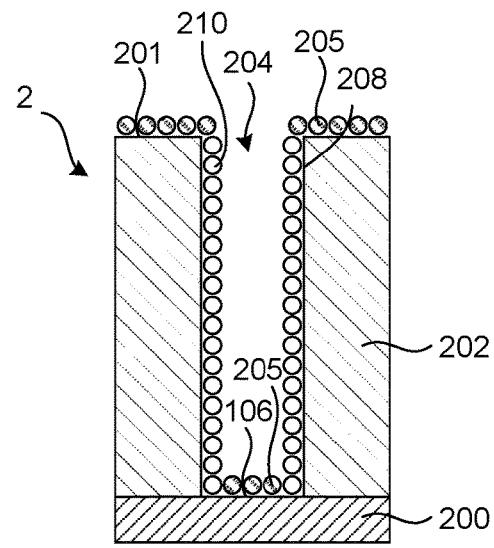

Still referring to FIG. 1, the process flow 1 further includes, in 104, exposing the substrate 2 to a plasma-excited halogen-containing gas 203 to deactivate the first precursor layer 210 on the field area 201 of the substrate 2 and on the bottom 206 of the recessed feature 204. The deactivation may form a halogenated first precursor layer 205 on the field area 201 of the substrate 2 and the bottom 206 of the recessed feature 204. This is schematically shown in FIGS. 2C and 2D. According to another embodiment, the exposing to the plasma-excited halogen-containing gas 203 may remove at least a portion of the first precursor layer 210 on the field area 201 of the substrate 2 and on the bottom 206 of the recessed feature 204. Non-limiting examples of the halogen-containing gas include $Cl_2$, $BCl_3$, $CCl_4$, HCl, HBr, $TiCl_4$, and a combination thereof. The halogen-containing gas can further include an inert gas such as Argon (Ar). In some examples, the plasma-excitation may be performed using a high density plasma source, for example an inductively coupled plasma (ICP) source or a microwave plasma source. The substrate may be biased through a substrate holder to further enhance the anisotropic characteristics of the plasma exposure. Further, processing conditions such as substrate temperature, gas pressure, and plasma power, may be selected to control the deactivation of the first precursor layer 210 and to minimize the damage to the substrate.

Figure 2E:
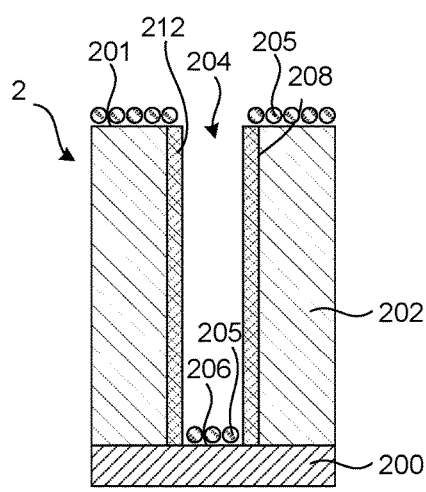

The process flow 1 further includes, in 106, exposing the substrate 2 to a second precursor gas that reacts with the first precursor layer 210 to form a material layer 212 on the sidewall 208 of the recessed feature 204 but not on the field area 201 and the bottom 206 of the recessed feature 204 that has been deactivated by the plasma-excited halogen-containing gas. In one example, the second precursor gas can include an oxygen-containing gas, a nitrogen-containing gas, an oxygen- and nitrogen-containing gas, or a combination thereof. The oxygen-containing gas can be selected from the group consisting of $H_2O$, $O_2$, $O_3$, $H_2O_2$, and a combination thereof. The oxygen-containing gas can include, but is not limited to, $O_2$, $H_2O$, $H_2O_2$, or a combination thereof, and optionally an inert gas such as Ar. Similarly, the nitrogen-containing gas can include, but is not limited to, $NH_3$ or hydrazine ($N_2H_4$), and optionally an inert gas such as Ar. The oxygen- and nitrogen-containing gas can include, but is not limited to, NO, $NO_2$, or $N_2O$, or a combination thereof, and optionally an inert gas such as Ar. The resulting substrate 2 is schematically shown in FIG. 2E.

Figure 2F:
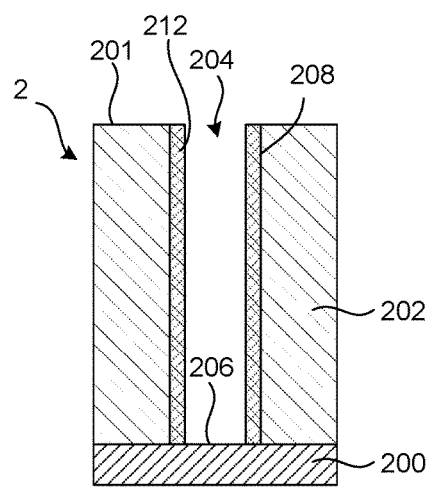

Thereafter, the halogenated first precursor layer 205 on the field area 201 and on the bottom 206 may be removed from the substrate 2 using a heat-treating step, an oxidation step, or a combination thereof. The resulting substrate 2 is schematically shown in FIG. 2F. The heat-treating step and/or the oxidation step may be carried out at a higher substrate temperature than the exposing steps 102-106. Further, the oxidation step may be carried out using stronger oxidizing conditions than were used in step 106.

In one example, the material layer 212 on the sidewall 208 of the recessed feature 204 may be used for sidewall protection to prevent loss of critical dimension of the recessed feature during a cleaning process or an etching process.

Exposing steps 102-106 may be repeated at least once as indicated by the process arrow 108 to deposit an additional amount of the material layer 212 on the sidewall 208 in the recessed feature 204. The exposing steps 102 and 106 may be described as an atomic layer deposition (ALD) process. ALD can deposit very thin films with atomic level thickness control and excellent conformality over advanced raised and recessed features.

The material layer 212 can, for example, contain an alkaline earth element, titanium, hafnium, zirconium, aluminum, a rare earth element, or any combination of two or more thereof.

According to one embodiment, the material layer 212 can include a metal oxide film. The metal oxide film can be a high-k film. In one example, the metal oxide film may be selected from the group consisting of $HfO_2$, $ZrO_2$, $TiO_2$, $Al_2O_3$, and a combination thereof. However, other metal oxide films may be used. According to another embodiment, the material layer 212 may be selected from the group consisting of a metal oxide film, a metal nitride film, a metal oxynitride film, a metal silicate film, and a combination thereof. According to yet another embodiment, the material layer 212 may contain a group IV element (Ti, Hf, or Zr) of the Periodic Table of the Elements, in combination with a non-group IV element.

In one example, the process flow in FIG. 1 may further include gas purging steps between the exposing steps 102 and 104, between the exposing steps 104 and 106, and between the exposing 106 and 102. The gas purging steps aid in removing unwanted gases from the process chamber by flowing an inert gas through the process chamber.

In some examples, a thickness of the material layer 212 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm. The presence of the material layer 212 on the sidewall 208 reduces the width 207 of the recessed feature 204. However, this change in width may be relatively small since the material layer 212 may be only a few nm thick.

According to one embodiment, the process flow 1 includes a) providing a substrate containing a field area and a recessed feature having a sidewall and a bottom, b) exposing the substrate to a hafnium precursor gas to form a hafnium precursor layer on the substrate, c) exposing the substrate to a plasma-excited $Cl_2$ gas to deactivate or at least partially remove the hafnium precursor layer on the field area of the substrate and the bottom of the recessed feature, d) exposing the substrate to an oxygen-containing gas that reacts with the hafnium precursor layer to form a hafnium oxide layer on the sidewall of the recessed feature but not on the field area and the bottom of the recessed feature that has been deactivated by the plasma-excited $Cl_2$ gas, and e) repeating steps b)-d) at least once to deposit an additional amount of the hafnium oxide layer on the sidewall in the recessed feature.

Figure 3:
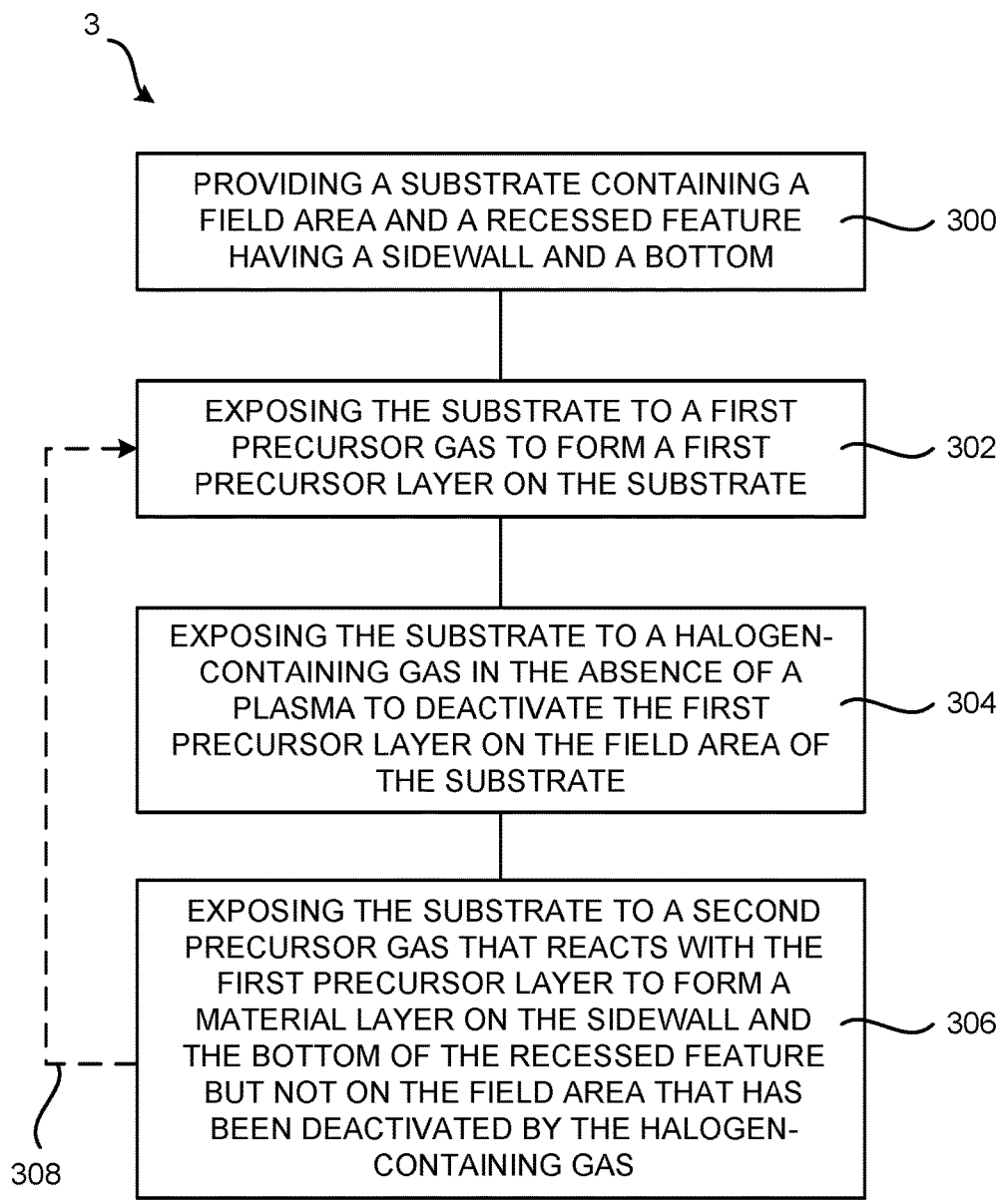
FIG. 3 is a process flow diagram for processing a substrate according to an embodiment of the invention.

FIG. 3 is a process flow diagram for processing a substrate according to an embodiment of the invention, and FIGS. 4A-4F schematically show through cross-sectional views a method of processing a substrate according to an embodiment of the invention.

The process flow 3 includes in 300, providing a substrate 4 containing a first film 402 and a second film 400. The first film 402 has a field area 401 and a recessed feature 404 having a sidewall 408 and a bottom 406. The recessed feature 404 can, for example, have a width 407 that is less than 200 nm, less than 100 nm, less than 50 nm, less than 25 nm, less than 20 nm, or less than 10 nm. In other examples, the recessed feature 404 can have a width 407 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The recessed feature 404 can, for example, have a depth of 25 nm, 50 nm, 100 nm, 200 nm, or greater.

In some examples, the first film 402 and the second film 400 may contain or consist of the same material. In one example, the first film 402 and the second film 400 may contain or consist of Si. In some examples, the first film 402 may contain a dielectric material, for example $SiO_2$, SiON, SiN, a high-k material, a low-k material, or an ultra-low-k material. The recessed feature 404 may be formed using well-known lithography and etching processes. Although not shown in FIG. 4A, a patterned mask layer may be present on the field area 401 and define the opening of the recessed feature 404.

Figure 4A:
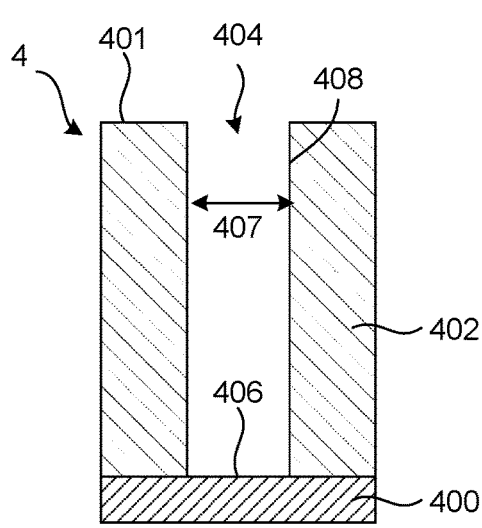
FIGS. 4A-4F schematically show through cross-sectional views a method of processing a substrate according to an embodiment of the invention.
Figure 4B:
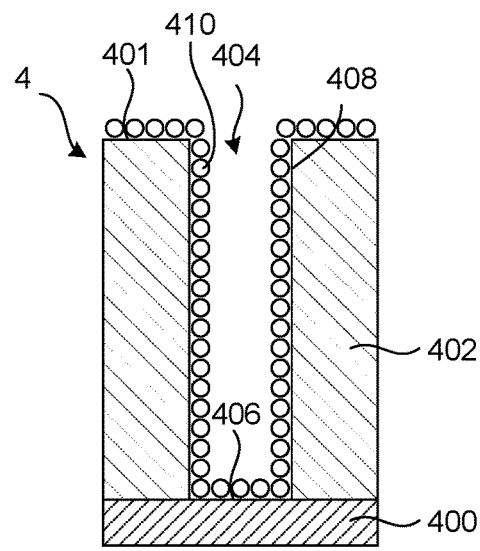

The process flow 3 further includes, in 302, exposing the substrate 4 to a first precursor gas to form a first precursor layer 410 on the substrate 4, including on the field area 401, the sidewall 408 and the bottom 406. This is schematically shown in FIG. 4B. The exposing may be a saturation exposure that forms a saturation coverage of the first precursor layer 410 on the substrate 4. In one example, the first precursor gas can include a metal-containing precursor and the first precursor layer 410 can form an adsorbed conformal layer of the metal-containing precursor that is approximately one atomic layer thick. The metal-containing precursor can, for example, contain an alkaline earth element, titanium, hafnium, zirconium, aluminum, a rare earth element, or any combination of two or more thereof.

Figure 4C:
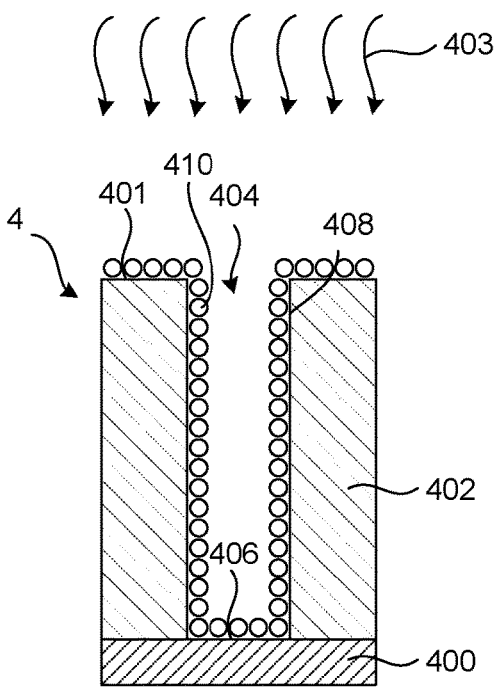
Figure 4D:
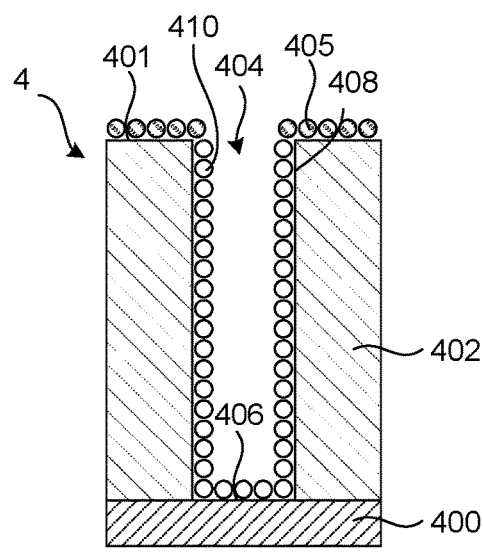

The process flow 3 further includes, in 304, exposing the substrate 4 to a halogen-containing gas 403 in the absence of a plasma to deactivate the first precursor layer 410 on the field area 401 of the substrate 4. The halogen-containing gas 403 is not excited by a plasma prior to exposure to the substrate. The deactivation may form a halogenated first precursor layer 405 on the field area 401 of the substrate 4. This is schematically shown in FIGS. 4C and 4D.

According to another embodiment, the exposing to the halogen-containing gas 403 in the absence of a plasma may remove at least a portion of the halogenated first precursor layer 405 on the field area 401 of the substrate 4. Non-limiting examples of the halogen-containing gas contain $Cl_2$, $BCl_3$, $CCl_4$, HCl, HBr, $TiCl_4$, and a combination thereof. The halogen-containing gas can further include an inert gas such as Argon (Ar).

Non-limiting examples of the halogen-containing gas contain $Cl_2$, $BCl_3$, $CCl_4$, HCl, HBr, $TiCl_4$, or a combination thereof. The halogen-containing gas can further include an inert gas such as Argon (Ar). The absence of plasma excitation preferentially deactivates the first precursor layer 410 on the field area 401 of the substrate 4 due to limited penetration of the halogen-containing gas 403 into the recessed feature 404. Further, processing conditions such as substrate temperature, gas pressure, gas composition, and substrate rotation during gas exposure may be selected to control the deactivation of the first precursor layer 410. In some examples, a highly diluted halogen-containing gas and high total gas pressure (e.g., greater than about 1 Torr) may be utilized to provide a highly isotropic exposure of the halogen-containing gas 403.

Figure 4E:
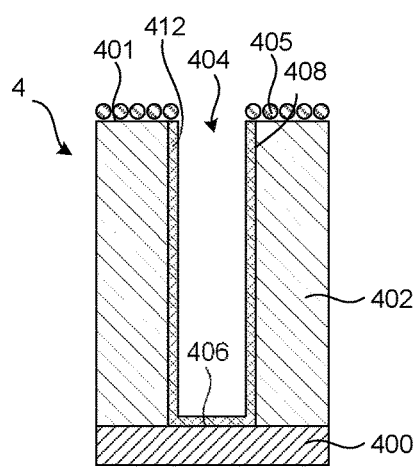

The process flow 3 further includes, in 306, exposing the substrate 4 to a second precursor gas that reacts with the first precursor layer 410 to form a material layer 412 on the sidewall 408 and the bottom 406 of the recessed feature 404 but not on the field area 401 that has been deactivated by the halogen-containing gas. In one example, the second precursor gas can include an oxygen-containing gas, a nitrogen-containing gas, an oxygen- and nitrogen-containing gas, or a combination thereof. The oxygen-containing gas can be selected from the group consisting of $H_2O$, $O_2$, $O_3$, $H_2O_2$, and a combination thereof. The oxygen-containing gas can include, but is not limited to, $O_2$, $H_2O$, or $H_2O_2$, or a combination thereof, and optionally an inert gas such as Ar. Similarly, the nitrogen-containing gas can include, but are not limited to, $NH_3$ or $N_2H_4$, and optionally an inert gas such as Ar. The oxygen- and nitrogen-containing gas can include, but is not limited to, NO, $NO_2$, or $N_2O$, or a combination thereof, and optionally an inert gas such as Ar. The resulting substrate 4 is schematically shown in FIG. 4E.

Figure 4F:
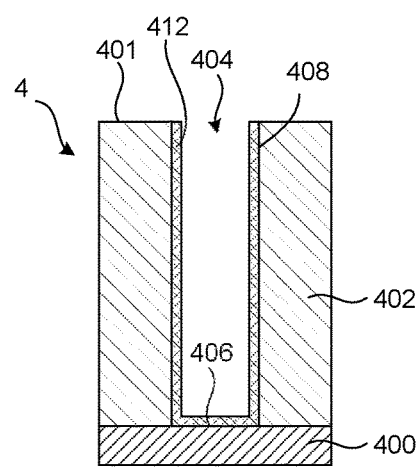

Thereafter, the halogenated first precursor layer 405 may be removed from the substrate 4 using a heat-treating step, an oxidation step, or a combination thereof. The resulting substrate 4 is schematically shown in FIG. 4F. The heat-treating step and/or the oxidation step may be carried out at a higher substrate temperature than the exposing steps 302-306. Further, the oxidation step may be carried out using stronger oxidizing conditions than were used in step 306.

Exposing steps 302-306 may be repeated at least once as indicated by the process arrow 308 to deposit an additional amount of the material layer 412 on the sidewall 408 and the bottom 406 in the recessed feature 404. The exposing steps 302 and 306 may be described as an ALD process. ALD can deposit very thin films with atomic level thickness control and excellent conformality over advanced raised and recessed features.

According to one embodiment, the material layer 412 can include a metal oxide film. The metal oxide film can be a high-k film. In one example, the metal oxide film may be selected from the group consisting of $HfO_2O$, $ZrO_2O$, $TiO_2O$, $Al_2O_3$, and a combination thereof. However, other metal oxide films may be used. According to another embodiment, the material layer 412 may be selected from the group consisting of a metal oxide film, a metal nitride film, a metal oxynitride film, a metal silicate film, and a combination thereof.

In one example, the process flow in FIG. 3 may further include gas purging steps between the exposing steps 302 and 304, between the exposing steps 304 and 306, and between the exposing 306 and 302. The gas purging steps aid in removing unwanted gases from the process chamber by flowing an inert gas through the process chamber.

In some examples, a thickness of the material layer 412 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm.

A plurality of embodiments for selective film deposition using halogen deactivation have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   a) providing a substrate containing a field area and a recessed feature having a sidewall and a bottom;
   b) exposing the substrate to a first precursor gas to form a first precursor layer on the substrate;
   c) exposing the substrate to a plasma-excited halogen-containing gas to deactivate or at least partially remove the first precursor layer on the field area of the substrate and the bottom of the recessed feature; and
   d) exposing the substrate to a second precursor gas that reacts with the first precursor layer to form a material layer on the sidewall of the recessed feature but not on the field area and the bottom of the recessed feature that has been deactivated by the plasma-excited halogen-containing gas.

2. The method of claim 1, further comprising
   e) repeating steps b)-d) at least once to deposit an additional amount of the material layer on the sidewall in the recessed feature.

3. The method of claim 1, wherein step c) forms a halogenated first precursor layer on the field area of the substrate and the bottom of the recessed feature, the method further comprising
   following step d), removing the halogenated first precursor layer from the substrate by heat-treating, performing an oxidation step, or a combination thereof.

4. The method of claim 1, wherein the first precursor gas contains a metal-containing precursor.

5. The method of claim 4, wherein the metal-containing precursor contains an alkaline earth element, titanium, hafnium, zirconium, aluminum, a rare earth element, or a combination of two or more thereof.

6. The method of claim 1, wherein the halogen-containing gas includes $Cl_2$, $BCl_3$, $CCl_4$, HCl, HBr, $TiCl_4$, or a combination thereof.

7. The method of claim 1, wherein the second precursor gas contains an oxygen-containing gas, a nitrogen-containing gas, an oxygen- and nitrogen-containing gas, or a combination thereof.

8. The method of claim 1, wherein the exposing the substrate to a plasma-excited halogen-containing gas further includes biasing a substrate holder supporting the substrate to provide anisotropic plasma exposure.

9. A substrate processing method, comprising:
   a) providing a substrate containing a field area and a recessed feature having a sidewall and a bottom;
   b) exposing the substrate to a hafnium precursor gas to form a hafnium precursor layer on the substrate;
   c) exposing the substrate to a plasma-excited $Cl_2$ gas to deactivate or at least partially remove the hafnium precursor layer on the field area of the substrate and the bottom of the recessed feature;
   d) exposing the substrate to an oxygen-containing gas that reacts with the hafnium precursor layer to form a hafnium oxide layer on the sidewall of the recessed feature but not on the field area and the bottom of the recessed feature that has been deactivated by the plasma-excited $Cl_2$ gas; and
   e) repeating steps b)-d) at least once to deposit an additional amount of the hafnium oxide layer on the sidewall in the recessed feature.

10. The method of claim 9, wherein step c) forms a chlorinated layer on the field area of the substrate and the bottom of the recessed feature, the method further comprising
    following step d), removing the chlorinated layer from the substrate by heat-treating, performing an oxidation step, or a combination thereof.

11. The method of claim 9, wherein the hafnium precursor includes $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), or $Hf(NMe_2)_4$ (tetrakis(dimethylamido)hafnium, TDMAH).

12. The method of claim 9, wherein the oxygen-containing gas is selected from the group consisting of $H_2O$, $O_2$, $O_3$, $H_2O_2$, and a combination thereof.

13. The method of claim 9, wherein the exposing the substrate to a plasma-excited $Cl_2$ gas further includes biasing a substrate holder supporting the substrate to provide anisotropic plasma exposure.

14. A substrate processing method, comprising:
    a) providing a substrate containing a field area and a recessed feature having a sidewall and a bottom;
    b) exposing the substrate to a first precursor gas to form a first precursor layer on the substrate;
    c) exposing the substrate to a halogen-containing gas in the absence of a plasma to deactivate or at least partially remove the first precursor layer on the field area of the substrate; and
    d) exposing the substrate to a second precursor gas that reacts with the first precursor layer to form a material layer on the sidewall and the bottom of the recessed feature but not on the field area that has been deactivated by the halogen-containing gas.

15. The method of claim 14, further comprising
    e) repeating steps b)-d) at least once to deposit an additional amount of the material layer on the sidewall and the bottom in the recessed feature.

16. The method of claim 14, wherein step c) forms a halogenated first precursor layer on the field area of the substrate, the method further comprising
    following step d), removing the halogenated first precursor layer from the substrate by heat-treating, performing an oxidation step, or a combination thereof.

17. The method of claim 14, wherein the first precursor gas contains a metal-containing precursor.

18. The method of claim 17, wherein the metal-containing precursor contains an alkaline earth element, titanium, hafnium, zirconium, aluminum, a rare earth element, or a combination thereof.

19. The method of claim 14, wherein the halogen-containing gas includes $Cl_2$, $BCl_3$, $CCl_4$, HCl, HBr, $TiCl_4$, or a combination thereof.

20. The method of claim 14, wherein the second precursor gas contains an oxygen-containing gas, a nitrogen-containing gas, an oxygen- and nitrogen-containing gas, or a combination thereof.

* * * * *